United States Patent
Kindaichi et al.

(10) Patent No.: US 11,453,957 B2
(45) Date of Patent: Sep. 27, 2022

(54) CRYSTAL GROWING APPARATUS AND CRUCIBLE HAVING A MAIN BODY PORTION AND A FIRST PORTION HAVING A RADIATION RATE DIFFERENT FROM THAT OF THE MAIN BODY PORTION

(71) Applicant: SHOWA DENKO K.K., Tokyo (JP)

(72) Inventors: Rimpei Kindaichi, Chiba (JP); Yoshishige Okuno, Chiba (JP); Tomohiro Shonai, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 78 days.

(21) Appl. No.: 16/702,905

(22) Filed: Dec. 4, 2019

(65) Prior Publication Data

US 2020/0181797 A1 Jun. 11, 2020

(30) Foreign Application Priority Data

Dec. 7, 2018 (JP) .............................. JP2018-230183

(51) Int. Cl.
   *C30B 35/00* (2006.01)
   *C30B 23/06* (2006.01)
   (Continued)

(52) U.S. Cl.
   CPC ........ *C30B 23/066* (2013.01); *C23C 14/0635* (2013.01); *C23C 14/243* (2013.01); *C30B 29/36* (2013.01); *C30B 35/002* (2013.01)

(58) Field of Classification Search
   CPC ......... C30B 23/00; C30B 23/02; C30B 23/06; C30B 23/066; C30B 29/00; C30B 29/10;
   (Continued)

(56) References Cited

U.S. PATENT DOCUMENTS

2005/0028725 A1\* 2/2005 Kato ..................... C30B 23/005
   117/13
2007/0240634 A1\* 10/2007 Radkevich ............ C30B 35/002
   117/200

(Continued)

FOREIGN PATENT DOCUMENTS

CN        202730295 U  *  2/2013
CN        204417640 U      6/2015
   (Continued)

OTHER PUBLICATIONS

Communication dated Apr. 23, 2021, from the China National Intellectual Property Administration in application No. 201911227890.9.

(Continued)

*Primary Examiner* — Kenneth A Bratland, Jr.
(74) *Attorney, Agent, or Firm* — Sughrue Mion, PLLC

(57) ABSTRACT

A crystal growing apparatus includes: a crucible which includes a main body portion, and a first portion having a radiation rate different from that of the main body portion, and is capable of controlling a temperature of a specific region inside during heating to a higher or lower temperature than that of the other regions; and a heating unit which is positioned on the outside of the crucible and is configured to heat the crucible by radiant heat, and the first portion is at a position where the crucible and a line segment connecting a heating center of the heating unit and the specific region intersect with each other.

8 Claims, 6 Drawing Sheets

(51) Int. Cl.
*C23C 14/24* (2006.01)
*C23C 14/06* (2006.01)
*C30B 29/36* (2006.01)

(58) Field of Classification Search
CPC ....... C30B 29/36; C30B 35/00; C30B 35/002; C23C 14/0635; C23C 14/243; F27B 14/06; F27B 14/061; F27B 14/08; F27B 14/0837; F27B 14/10; F27B 14/12; F27B 14/20
USPC .......................... 117/84, 200, 204, 937, 951
See application file for complete search history.

(56) References Cited

U.S. PATENT DOCUMENTS

| | | | | |
|---|---|---|---|---|
| 2008/0107844 A1* | 5/2008 | Ito | ........................... | C23C 16/30 428/34.1 |
| 2009/0116019 A1* | 5/2009 | Stoddard | ................. | C30B 29/06 73/579 |
| 2009/0158994 A1* | 6/2009 | Miyanaga | ............. | C30B 29/403 117/200 |
| 2012/0156122 A1* | 6/2012 | Nishiguchi | ............. | C30B 23/00 117/84 |
| 2015/0230293 A1* | 8/2015 | Steinlage | .............. | F27B 14/061 219/634 |
| 2015/0361580 A1* | 12/2015 | Huang | .................... | C30B 23/02 117/109 |
| 2018/0002828 A1* | 1/2018 | Loboda | .................. | C30B 29/36 |

FOREIGN PATENT DOCUMENTS

| | | | | |
|---|---|---|---|---|
| CN | 105239157 A | | 1/2016 | |
| CN | 206418222 U | | 8/2017 | |
| CN | 209481848 U | * | 10/2019 | |
| JP | 2008-290885 A | | 12/2008 | |
| JP | 2015-212207 A | | 11/2015 | |
| WO | WO-9003952 A1 | * | 4/1990 | ............. C30B 29/06 |
| WO | WO-2020087724 A1 | * | 5/2020 | ............. C30B 29/36 |

OTHER PUBLICATIONS

EP 2059946 A4 (two-page search report for appl. No. EP 07842416), dated Sep. 15, 2011.

* cited by examiner

CRYSTAL GROWING APPARATUS AND CRUCIBLE HAVING A MAIN BODY PORTION AND A FIRST PORTION HAVING A RADIATION RATE DIFFERENT FROM THAT OF THE MAIN BODY PORTION

BACKGROUND OF THE INVENTION

Field of the Invention

The present invention relates to a crystal growing apparatus and a crucible.

Priority is claimed on Japanese Patent Application No. 2018-230183, filed on Dec. 7, 2018, the content of which is incorporated herein by reference.

Description of Related Art

Silicon carbide (SiC) has a greater dielectric breakdown electric field by one digit and a band gap three times greater than those of silicon (Si). In addition, silicon carbide (SiC) has properties such as thermal conductivity approximately three times higher than that of silicon (Si). Accordingly, silicon carbide (SiC) is expected to be applied for a power device, a high frequency device, and a high-temperature operation device, and the like. Thus, in recent years, a SiC epitaxial wafer has been used in such a semiconductor device.

The SiC epitaxial wafer is manufactured by growing the SiC epitaxial film, which becomes an active region of a SiC semiconductor device, on a SiC single crystal substrate by chemical vapor deposition (CVD).

The SiC single crystal substrate is manufactured by cutting a SiC single crystal. This SiC single crystal can be generally obtained by a sublimation method. The sublimation method is a method of disposing a seed crystal formed of a SiC single crystal on a pedestal disposed in a graphite crucible, supplying a sublimation gas sublimated from a raw material powder in the crucible to the seed crystal by heating the crucible, and growing the seed crystal to a greater SiC single crystal.

In recent years, demands for an increase in diameter and length of the SiC single crystal are also increased along market demands. In addition, it is also necessary to realize high quality and improve production efficiency of the SiC single crystal, together with an increase in diameter and length of the SiC single crystal.

Japanese Unexamined Patent Application, First Publication No. 2008-290885 discloses that a partition wall portion is provided between heaters divided in a height direction. The partition wall portion controls thermal conduction between the divided heaters, controls radiant heat transferred from the heater to the crucible, and insulates a seed crystal side and a raw material side from each other. A manufacturing device of the silicon carbide single crystal disclosed in Japanese Unexamined Patent Application, First Publication No. 2008-290885 separately controls the seed crystal side and the raw material side of the crucible by the partition wall portion.

Japanese Unexamined Patent Application. First Publication No. 2015-212207 discloses that a heat insulating material which blocks heat from an upper surface of the center of the raw material towards the seed crystal side is disposed in the crucible. The heat insulating material equalizes a temperature of the entire raw material.

SUMMARY OF THE INVENTION

However, the partition wall portion disclosed in Japanese Unexamined Patent Application. First Publication No. 2008-290885 can prevent the thermal conduction between the divided heaters and thermally separate the seed crystal side and the raw material side, but a temperature distribution in the crucible due to heat radiation (thermal radiation) from a heater may not be sufficiently controlled. In a temperature range for growing a SiC single crystal, the effect of the heat radiation (thermal radiation) is greater than thermal conduction. A partition wall portion disclosed in First Publication No. 2008-290885 is for separating a seed crystal side and a raw material side, from a viewpoint of temperature, but a temperature in a specific region in the crucible cannot be controlled. In addition, the heat insulating material disclosed in Japanese Unexamined Patent Application, First Publication No. 2015-212207 is disposed in the crucible and the temperature distribution may not be freely designed.

The invention has been made to solve the aforementioned problems and an object thereof is to provide a crystal growing apparatus capable of controlling a temperature distribution in a crucible, and a crucible.

As a result of intensive studies, the inventors have found that, by changing a radiation rate of a predetermined portion of a crucible with that of another portion, the effect of heat radiation can be controlled and a temperature distribution in the crucible can be controlled. That is, the invention provides the following means, for solving the aforementioned problems.

(1) A crystal growing apparatus according to a first aspect includes: a crucible which includes a main body portion, and a first portion having a radiation rate different from that of the main body portion, and is capable of controlling a temperature of a specific region inside during heating to a higher or lower temperature than that of the other regions; and a heating unit which is positioned on the outside of the crucible and is configured to heat the crucible by radiant heat, and the first portion is at a position where the crucible and a line segment connecting a heating center of the heating unit and the specific region intersect with each other.

(2) In the crystal growing apparatus according to (1), the first portion is exposed to an outer surface of the crucible at a position where the crucible and the line segment connecting the heating center of the heating unit and the specific region intersect with each other.

(3) In the crystal growing apparatus according to (1) or (2), the specific region is one or more selected from the group consisting of a lower portion of a raw material contained in the crucible, an outer portion in a radial direction of a portion where a seed crystal is installed in the crucible, and a guide portion which is configured to control a flow of a raw material gas from the raw material towards the seed crystal and has a diameter decreasing from a surface of the raw material toward the seed crystal, and the radiation rate of the first portion is higher than the radiation rate of the main bxly portion.

(4) In the crystal growing apparatus according to (3), an outer surface of the main body portion may be a flat surface, and an outer surface of the first portion may have ruggedness.

(5) In the crystal growing apparatus according to (1) or (2), the specific region is a portion where the seed crystal is installed in the crucible, and the radiation rate of the first portion is lower than the radiation rate of the main body portion.

(6) In the crystal growing apparatus according to (5), the main body portion may be a graphite, and the first portion may be a simple substance, carbide, or nitride including an element selected from the group consisting of Ta, Mo, Nb, H, W, and Zr, or a mixture thereof.

(7) In the crystal growing apparatus according to (5) or (6), an outer surface of the main body portion may have ruggedness, and an outer surface of the first portion may be a flat surface.

(8) In the crystal growing apparatus according to any one of (1) to (7), a height of the first portion may be within 50% of a height of the crucible.

(9) A crucible according to a second aspect includes a main body portion and a first portion having a radiation rate different from that of the main body portion, and the first portion is exposed to an outer surface.

According to the crystal growing apparatus according to the aspect, it is possible to control a temperature distribution in the crucible.

DETAILED DESCRIPTION OF THE INVENTION

Hereinafter, a crystal growing apparatus and a crucible according to embodiments will be described in detail suitably with reference to the drawings. The drawings used in the following description may show enlarged characteristic parts for easy understanding of the characteristics of the invention, and a dimensional rate and the like of each constituent element may be different from the actual values. Materials, dimensions, and the like shown in the following description are merely an example, the invention is not limited thereto, and modifications can be suitably performed within a range not departing from the gist thereof.

Crystal Growing Apparatus

First Embodiment

Figure 1:
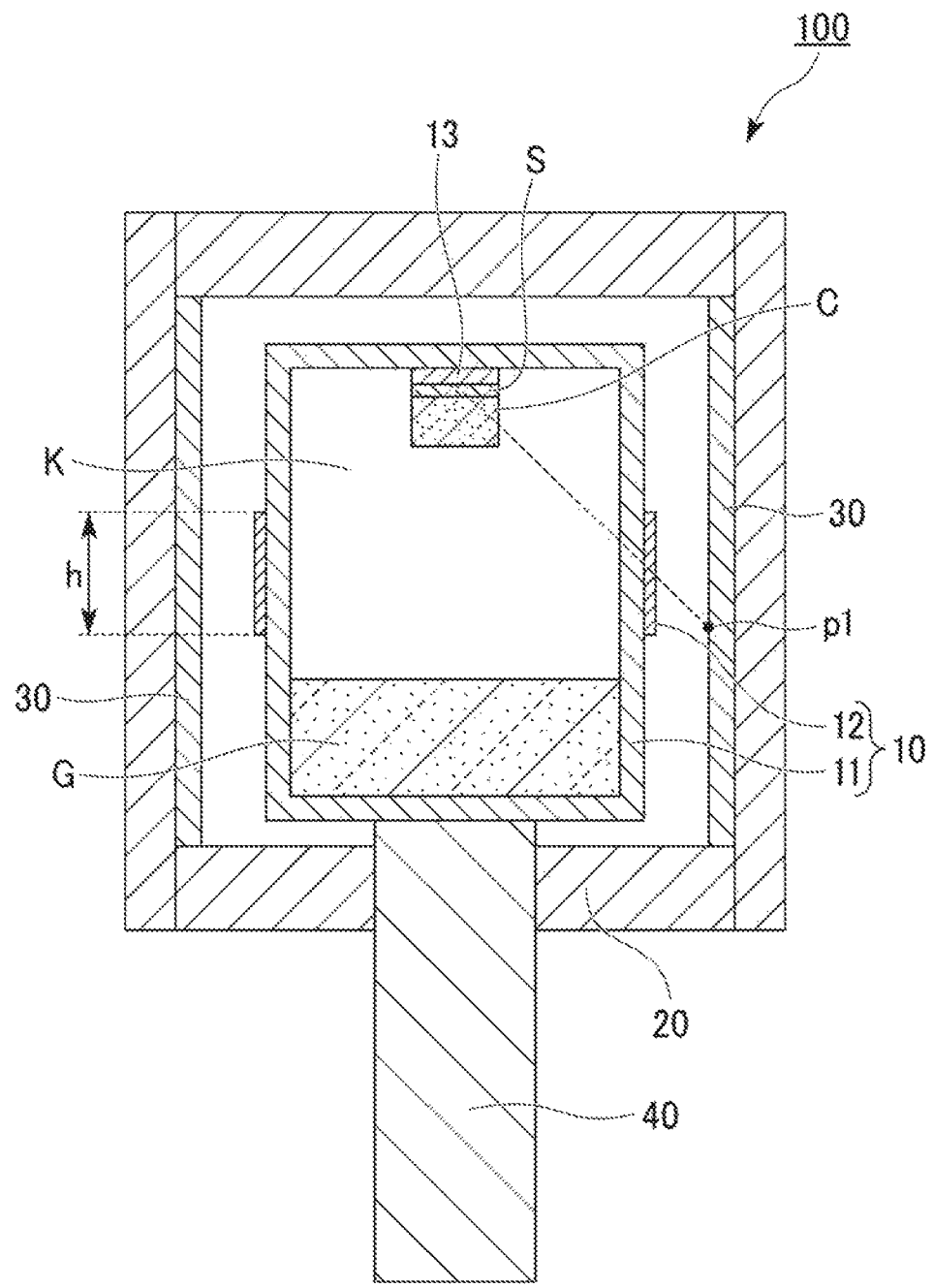
FIG. 1 is a cross-sectional schematic view of a crystal growing apparatus according to a first embodiment.

FIG. 1 is a cross-sectional schematic view of a crystal growing apparatus according to a first embodiment. A crystal growing apparatus 100 shown in FIG. 1 includes a crucible 10, a heat insulating material 20, a heating unit 30, and a support 40. In FIG. 1, for easy understanding, a raw material G, a seed crystal S, and a single crystal C crystal-grown on the seed crystal S are shown at the same time.

In the following drawings, a perpendicular direction to a support surface on which the crucible 10 is supported by the support 40 is set as a vertical direction, and a direction orthogonal to the vertical direction is set as a radial direction. FIG. 1 is a cross-sectional view cut to have a random cross section along a center axis of the support 40.

The crucible 10 surrounds a growth space K for crystal growing of the single crystal C. The crucible 10 includes a main body portion 11, a low radiation portion 12, and a crystal installation portion 13. A bottom portion of the crucible 10 is filled with the raw material G, in a case of the crystal growing of the single crystal C by a sublimation method. The crystal installation portion 13 is on a position facing the raw material G. The seed crystal S is installed on the crystal installation portion 13, in a case of the crystal growing of the single crystal C by the sublimation method. A raw material gas sublimated from the raw material G is re-crystallized on the surface of the seed crystal S, thereby the single crystal C growing.

The main body portion 11 is a portion surrounding the growth space K. The main body portion 11 is formed of a material capable of withstanding a high temperature, in a case of growing the single crystal C. The main body portion 11 is, for example, composed of a graphite. A sublimation temperature of the graphite is extremely high as 3,550° C. and the graphite can withstand a high temperature during the crystal growing.

The low radiation portion 12 has a radiation rate lower than that of the main body portion 11. The radiation rate is also referred to as an emissivity. The radiation rate is a rate of an energy radiated by an object by the heat radiation to an energy radiated by a black body at the same temperature. In a case where the radiation rate is high, the heat absorption is easily performed, and in a case where the radiation rate is low, the heat absorption is hardly performed. The low radiation portion 12 is an example of a "first portion".

The low radiation portion 12 includes a simple substance, carbide, or nitride including an element selected from the group consisting of Ta, Mo, Nb, Hf, W, and Zr, or a mixture thereof. The low radiation portion 12 is, for example, TaC, Ta, W, WC, Mo, $Mo_2C$, Nb, or NbC. The radiation rate of TaC depends on a shape or a roughness of a surface, oxidation, a measurement temperature, or a measurement wavelength, and is, for example, 0.1 to 0.5. The radiation rate of W is, for example, 0.1 to 0.3, and the radiation rate of Mo is, for example, 0.1 to 0.4. The radiation rate of the graphite is, for example, 0.7 to 0.95, and the radiation rate is higher than that of these materials.

The low radiation portion 12 shown in FIG. 1 is at a portion where a line segment, which connects crystal installation portion 13 and the heating unit 30, and the crucible 10 intersect with each other. A first end of the line segment is the center of the crystal installation portion 13, and a second end is a heating center p1 of the heating unit 30. The crystal installation portion 13 is an example of a "specific region" and is a portion where the seed crystal S is installed in the crucible 10. The heating center p1 is a portion of the heating unit 30 where the temperature is the highest. In a case where the temperature of the heating unit 30 is uniform in the height direction, for example, the center of the heating unit 30 in the vertical direction may be the heating center p1.

The low radiation portion 12 inhibits the heat radiation and prevents the crystal installation portion 13 from having a high temperature. The heat radiation radially spreads from a heat generation portion. The heat radiation generates most strongly in the heating center p of the heating unit 30. In a case where the low radiation portion 12 is on a line segment connecting the crystal installation portion 13 and the heating unit 30, the heat radiation is inhibited by the low radiation portion 12 and hardly approaches the crystal installation portion 13. As a result, the temperature of the crystal installation portion 13 becomes lower than that of the other regions.

The low radiation portion 12 is, for example, exposed to the outer surface of the crucible 10. The outer surface of the crucible 10 is a surface to which the heat radiation from the heating unit 30 is incident. The heat radiation is strongly affected by the state of the outer surface of the crucible 10. In a case where the low radiation portion 12 is exposed to the outer surface of the crucible 10, the low radiation portion 12 can prevent the effect of the heat radiation to the crystal installation portion 13. The low radiation portion 12 may also be provided inside of the crucible 10.

A height h of the low radiation portion 12 is preferably within 50% and more preferably within 30% of the height of the crucible 10. The height h of the low radiation portion 12 means a width of the low radiation portion 12 in the vertical direction. In a case where the height h of the low radiation portion 12 is in the range described above, it is possible to sufficiently heat the other regions while controlling the temperature of the specific region.

The heat insulating material 20 covers the surrounding of the crucible 10 and the heating unit 30. A temperature of the crucible 10 is maintained by the heat insulating material 20.

The heat insulating material 20 is preferably configured with a material having a thermal conductivity equal to or smaller than 10 W/mK at a high temperature equal to or higher than 2,000° C. As the material having a thermal conductivity equal to or smaller than 10 W/mK at a high temperature equal to or higher than 2,000° C., a felt material including graphite and carbon as main components is used. In addition, the heat insulating material 20 is desirably a member having a thermal conductivity equal to or smaller than 5 W/mK.

The heating unit 30 is positioned on an outer side of the crucible 10. The heating unit. 30 shown in FIG. 1 is positioned on an outer side of the crucible 10 in the radial direction and on an inner side of the heat insulating material 20 in the radial direction. The heating unit 30 is heated by induction heating by receiving a magnetic field generated by a coil (not shown) positioned on an outer periphery of the heat insulating material 20. The heat-generated heating unit 30 is a generation source of the heat radiation and heats the crucible 10 by the radiant heat. The heating unit 30 is, for example, a graphite member. The heating unit 30 is also referred to as a heater.

The support 40 is positioned on a lower portion of the crucible 10 and supports the crucible 10. The support 40 can rotate in the radial direction. In a case where the support 40 rotates in the radial direction by a driving device (not shown) and the crucible 10 also rotates with the support 40.

According to the crystal growing apparatus 100 according to the first embodiment, the temperature of the crystal installation portion 13 in the crucible 10 can be controlled to be lower than the temperature of the other regions. The crystal installation portion 13 is a portion where the seed crystal S is installed and the single crystal C is crystal-grown. In a case where the temperature of the crystal installation portion 13 becomes lower than the temperature of the other regions, the re-crystallization of the single crystal C is promoted and the single crystal C can be efficiently grown.

Hereinabove, the first embodiment has been described, but the invention is not limited to the specific embodiments, and various modifications and changes can be performed within a range of the gist of the invention described in claims.

Modification Example 1

Figure 2:
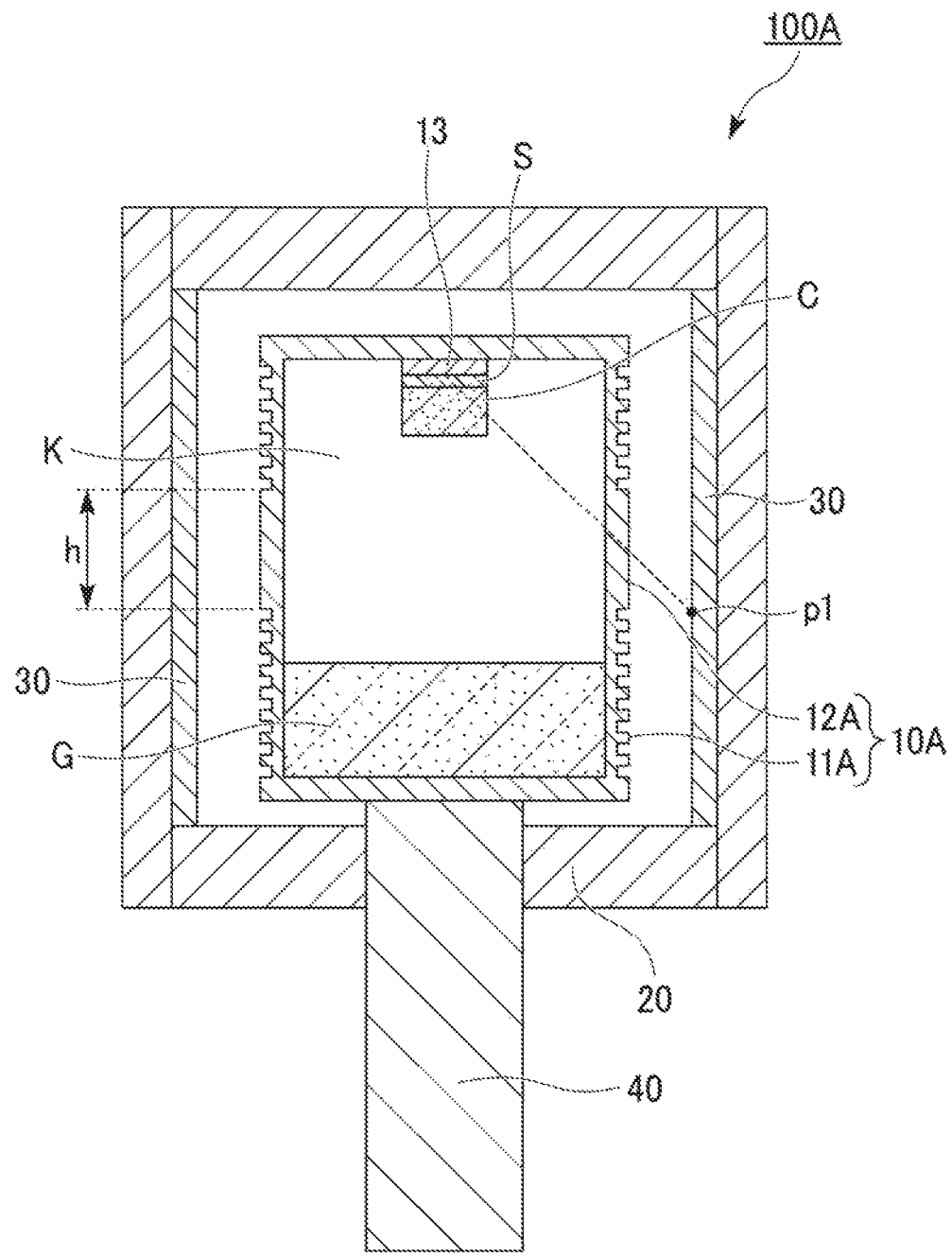
FIG. 2 is a cross-sectional schematic view of a crystal growing apparatus according to Modification Example 1.

FIG. 2 is a cross-sectional schematic view of a crystal growing apparatus 100A according to Modification Example 1. In the crystal growing apparatus 100A, a configuration of a crucible 10A is different from the crucible 10 of the crystal growing apparatus 100. The other configurations are the same, the same reference numerals are used for the same configurations, and a description thereof is omitted.

The crucible 10A shown in FIG. 2 includes a main body portion 11A and a low radiation portion 12A. The ruggedness is formed on an outer surface (outer side surface) of the main body portion 11A. With respect to this, the outer surface of the low radiation portion 12A is a flat surface.

The radiation rate also changed in accordance with the surface state of an object. In a case where the ruggedness is formed on the surface of the object, an effective radiation rate of the portion having the ruggedness increases. It is because that the area for absorbing radiation light from the heating unit 30 increases. That is, the low radiation portion 12A has a radiation rate lower than that of the main body portion 11A due to a difference in the surface shape.

The main body portion 11A and the low radiation portion 12A may be formed of the same material or may be formed of different materials. The material used for the main body portion 11A and the low radiation portion 12A is the same as that for the main body portion 11 and the low radiation portion 12 of the first embodiment. For example, both the material used for the main body portion 11A and the low radiation portion 12A are formed of graphite and only the surface shape may be different from each other.

The low radiation portion 12A inhibits the heat radiation and prevents the crystal installation portion 13 from having a high temperature. In the crystal growing apparatus 100A according to Mollification Example 1, by decreasing the temperature of the crystal installation portion 13 to be lower than that of the other regions, the re-crystallization of the single crystal C is promoted, and the single crystal C can be efficiently grown.

Second Embodiment

Figure 3:
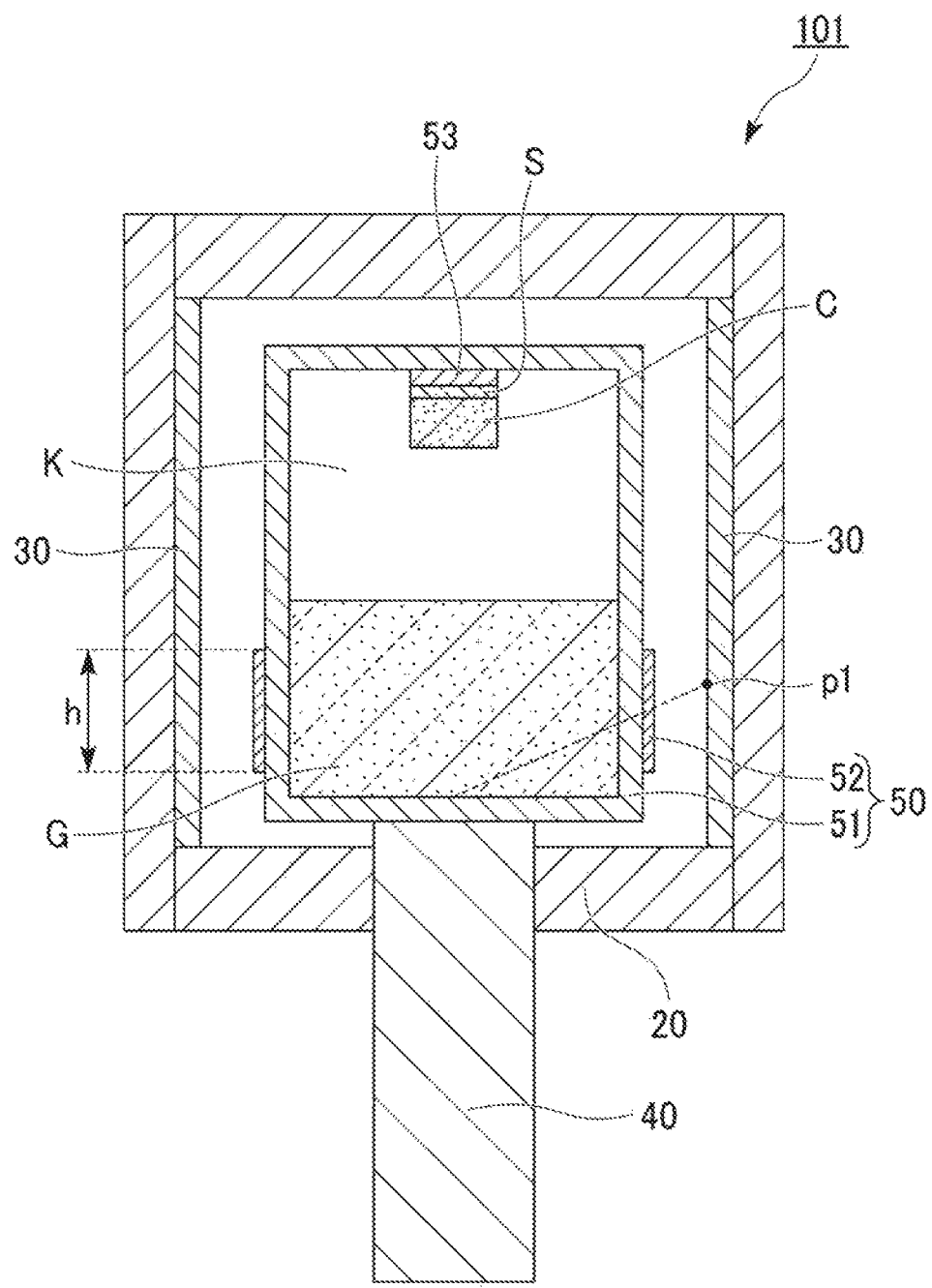
FIG. 3 is a cross-sectional schematic view of a crystal growing apparatus according to a second embodiment.

FIG. 3 is a cross-sectional schematic view of a crystal growing apparatus 101 according to a second embodiment. In the crystal growing apparatus 101, a configuration of a crucible 50 is different from the crucible 10 of the crystal growing apparatus 100. The other configurations are the same, the same reference numerals are used for the same configurations, and a description thereof is omitted.

The crucible 50 includes a main body portion 51, a high radiation portion 52, and a crystal installation portion 53. The high radiation portion 52 has a radiation rate higher than that of the main body portion 51. The high radiation portion 52 is an example of the "first portion". The crystal installation portion 53 is the same as the crystal installation portion 13 shown in FIG. 1. A height h of the high radiation portion 52 is the same as the height of the low radiation portion 12.

The high radiation portion 52, for example, includes a material having a radiation rate higher than that of the main body portion 51. For example, a material of the low radiation portion 12 according to the first embodiment may be used for the main body portion 51 and a material of the main body portion 11 may be used for the high radiation portion 52.

The high radiation portion 52 shown in FIG. 3 is at a position where a line segment, which connects a lower portion (center in the lower portion) of the raw material G contained in the crucible 50 and the heating center p1 of the heating unit 30, and the crucible 50 intersect with each other. The lower portion (center in the lower portion) of the raw material G contained in the crucible 50 is an example of the "specific region". The lower portion of the raw material G is, for example, a portion positioned lower than the raw material G. Specifically, the lower portion of the raw material G is, for example, a bottom surface of the crucible 50. The center of the lower portion of the raw material G is, for example, in the vicinity of the center of the bottom surface of the crucible 50 in a radial direction.

The high radiation portion 52 absorbs a large amount of heat radiation than the main body portion 51 and the temperature of the raw material G increases. In a case where the high radiation portion 52 is on a line segment, which connects the center of the raw material G in a lowest side of the raw material G and the heating center p1 where the heat radiation strongly occurs, the heat radiation is efficiently absorbed by the high radiation portion 52. As a result, the temperature of the lower portion of the raw material G is comparatively increased in the raw material G.

The high radiation portion 52 is, for example, exposed to the outer surface of the crucible 50. The outer surface of the crucible 50 is a surface to which a heat radiation from the heating unit 30 is incident. The heat radiation is strongly affected by the state of the outer surface of the crucible 50. In a case where the high radiation portion 52 is exposed to the outer surface of the crucible 50, the raw material G is efficiently heated. The high radiation portion 52 may also be provided inside of the crucible 50.

According to a crystal growing apparatus 101 according to a second embodiment, it is possible to control the lower portion of the raw material G contained in the crucible 50 to have a comparative high temperature in the raw material G. In a case where the raw material G is efficiently heated, the sublimation amount of the raw material G increases. An increase in sublimation amount of the raw material G causes an increase in growth amount of the single crystal C.

Hereinabove, the second embodiments has been described, but the invention is not limited to the specific embodiments, and various modifications and changes can be performed within a range of the gist of the invention described in claims.

Modification Example 2

Figure 4:
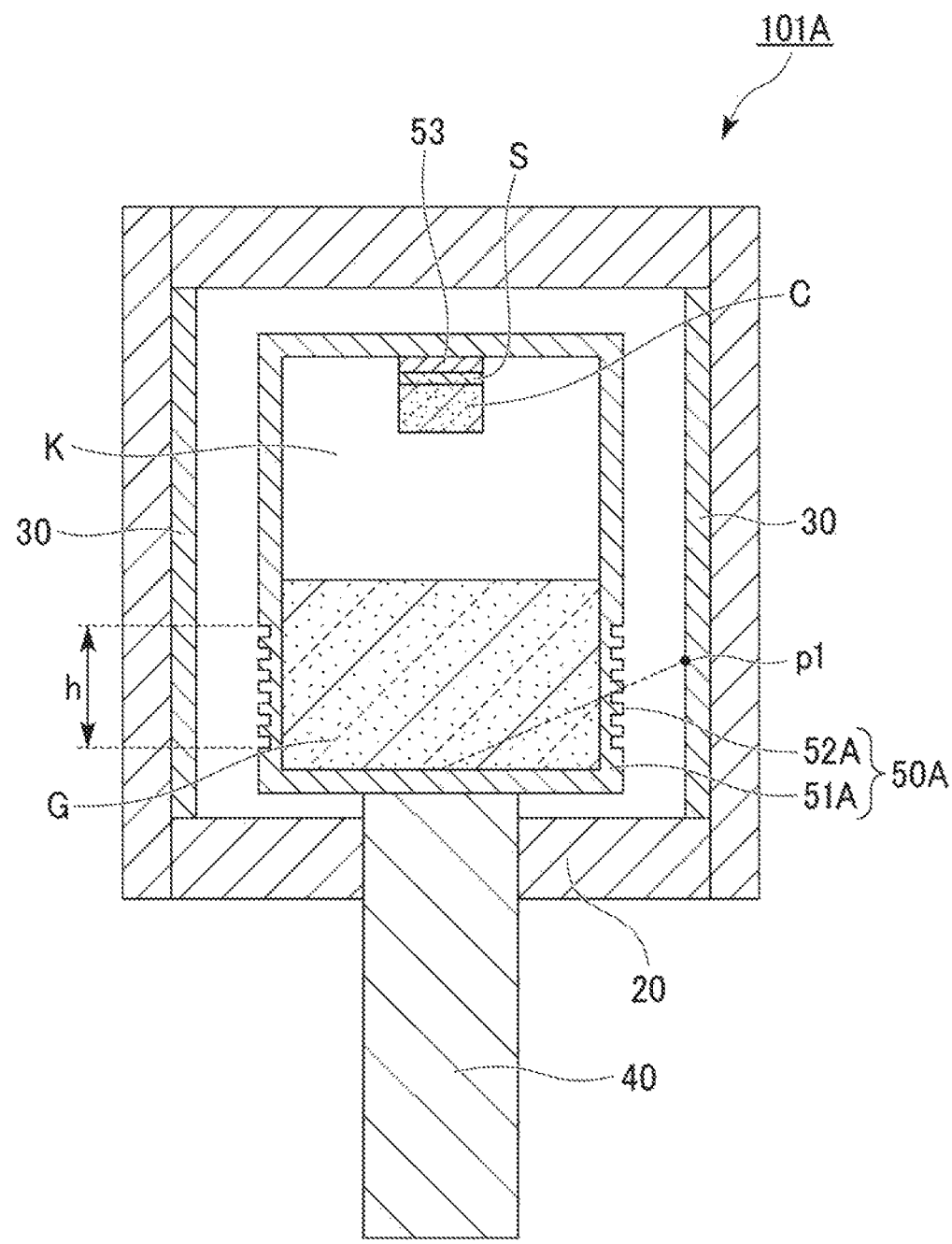
FIG. 4 is a cross-sectional schematic view of a crystal growing apparatus according to Modification Example 2.

FIG. 4 is a cross-sectional schematic view of a crystal growing apparatus 101A according to Modification Example 2, in the crystal growing apparatus 101A, a configuration of a crucible 50A is different from the crucible 50 of the crystal growing apparatus 101. The other configurations are the same, the same reference numerals are used for the same configurations, and a description thereof is omitted.

The crucible 50A shown in FIG. 4 includes a main body portion 51A and a high radiation portion 52A. The outer surface (outer side surface) of the main body portion 51A is a flat surface. With respect to this, the ruggedness is formed on an outer surface of the high radiation portion 52A. The radiation rate also changed in accordance with the surface state of an object. The effective radiation rate of the high radiation portion 52A is higher than that of the main body portion 51A due to the effect of a difference in surface shape.

The main body portion 51A and the high radiation portion 52A may be formed of the same material or may be formed of different materials. The material used for the main body portion 51A and the high radiation portion 52A is the same as that for the main body portion 11 and the low radiation portion 12 of the first embodiment. For example, both the material used for the main body portion 51A and the high radiation portion 52A are formed of graphite and only the surface shape may be different from each other.

The high radiation portion 52A efficiently absorbs heat radiation and the raw material G is heated. In the crystal growing apparatus 101A according to Modification Example 2, by increasing the temperature of the raw material G, the sublimation amount of the raw material G can increase and the single crystal C can be efficiently grown.

Third Embodiment

Figure 5:
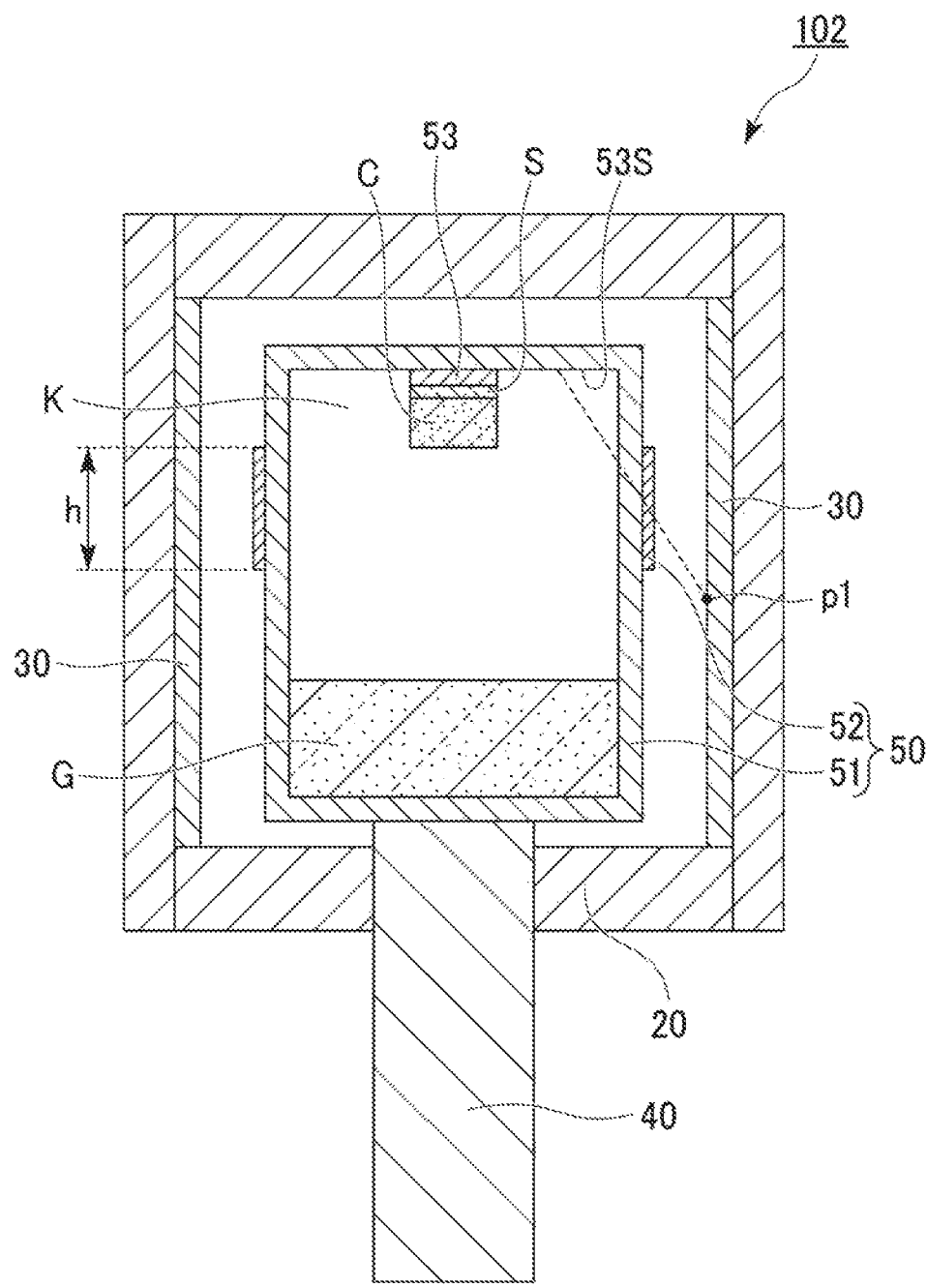
FIG. 5 is a cross-sectional schematic view of a crystal growing apparatus according to a third embodiment.

FIG. 5 is a cross-sectional schematic view of a crystal growing apparatus 102 according to a third embodiment. In the crystal growing apparatus 102, a position of the high radiation portion 52 is different from that in the crystal growing apparatus 101. The other configurations are the same, the same reference numerals are used for the same configurations, and a description thereof is omitted.

The high radiation portion 52 shown in FIG. 5 is at a position where a line segment, which connects a crystal side portion 53S and the heating center p1 of the heating unit 30, and the crucible 50 intersect with each other. The crystal side portion 53S is an outer portion in a radial direction of a crystal installation portion 53 where the seed crystal S is installed in the crucible 50, and preferably positioned along an inside wall of an upper plane of the crucible 50. A first end of the line segment is the center of the crystal side portion 53S in a radial direction. The crystal side portion 53S is an example of the "specific region".

The crystal growing apparatus 102 according to the third embodiment can control the crystal side portion 53S to have a higher temperature than that of the other regions. A part of a raw material gas sublimated from the raw material G approaches the crystal side portion 53S. The crystal that is re-crystallized in the crystal side portion 53S does not contribute to the growth of the single crystal C. The raw material gas is lost by the amount of the re-crystallization in the crystal side portion 53S. In a case where the crystal side portion 53S is efficiently heated, the re-crystallization in the crystal side portion 53S can be prevented, and the effective crystal growth of the single crystal C is promoted.

The crystal growing apparatus 102 according to the third embodiment may also generate a difference in effective radiation rate by the difference in surface shape, in the same manner as in Modification Example 2 according to the second embodiment.

Fourth Embodiment

Figure 6:
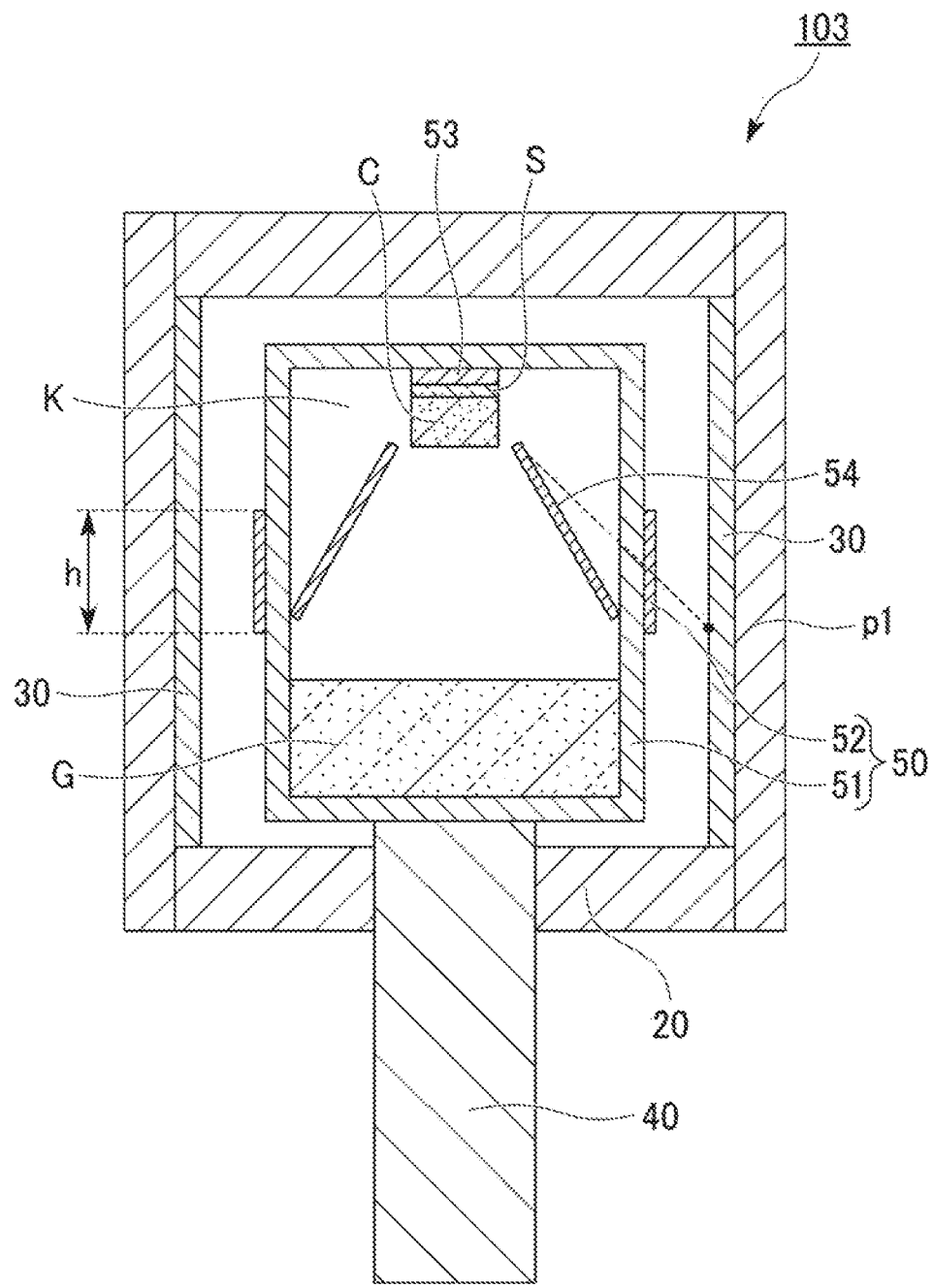
FIG. 6 is a cross-sectional schematic view of a crystal growing apparatus according to a fourth embodiment.

FIG. 6 is a cross-sectional schematic view of a crystal growing apparatus 103 according to a fourth embodiment. The crystal growing apparatus 103 is different from the crystal growing apparatus 101 in the position of the high radiation portion 52 and in that the crucible 50 includes a guide portion 54. The other configurations are the same, the same reference numerals are used for the same configurations, and a description thereof is omitted.

The guide portion 54 controls a flow of a raw material gas from the raw material G towards the seed crystal S. The guide portion 54 has a diameter decreasing from a surface of the raw material G toward the seed crystal S. The guide portion is mainly configured of a graphite member. The guide portion 54 is, for example, formed of a simple substance, carbide, or nitride including an element selected from the group consisting of Ta, Mo, Nb, Hf, W, and Zr, or a mixture thereof, and a graphite coated with these members.

The high radiation portion 52 shown in FIG. 6 is at a position where a line segment, which connects the guide portion 54 and the heating center p1 of the heating unit 30, and the crucible 50 intersect with each other. A first end of the line segment is connected to an end of the guide portion 54 on the seed crystal S side. The guide portion 54 is an example of the "specific region".

The crystal growing apparatus 103 according to the fourth embodiment can control the guide portion 54 to have a higher temperature than that of the other regions. The raw material gas sublimated from the raw material G flows along the guide portion 54 and approaches the single crystal C. In a case where the crystal that is re-crystallized on the guide portion 54 comes into contact with the single crystal C, a defect or strain occurs in the single crystal C. In a case where the guide portion 54 is efficiently heated, the re-crystallization on the guide portion 54 can be prevented.

The crystal growing apparatus 103 according to the fourth embodiment may also generate a difference in effective radiation rate by the difference in surface shape, in the same manner as in Modification Example 2 according to the second embodiment.

Hereinabove, the preferred embodiments of the invention has been described, but the invention is not limited to the specific embodiments, and various modifications and changes can be performed within a range of the gist of the invention described in claims.

The low radiation portion 12 and the high radiation portion 52 are, for example, formed by coating. The coating can be performed in an optional portion after forming the main body portion 11 or 51. The coating portions of the low radiation portion 12 and the high radiation portion 52 are designed by the configurations (presence or absence of the guide portion 54, amount of raw material G contained, and the like) in the crucibles 10 and 50. In addition, the low radiation portion 12 and the high radiation portion 52 formed by the coating are exposed to the outer surfaces of the crucibles 10 and 50, and an effect of inhibiting or absorbing the heat radiation is efficiently obtained.

EXAMPLES

Comparative Example 1

The configuration shown in FIG. 1 was reproduced with a simulation, and a temperature in a crucible during the heating of the crucible was obtained. In the simulation, a FEM analysis software, ANSYS Mechanical was used.

The simulation was performed only with a structure of a half (half in the radial direction) of any cross section passing through the center axis, in order to reduce computational cost. The simulation was performed in an empty crucible without containing the raw material G. The conditions of the simulation were as shown below.

Crucible outer radius: 150 mm
Crucible thickness: 10 mm
Crucible height: 420 mm
Radiation rate of main body portion of crucible: 0.8 (corresponding to graphite)
Crucible thermal conductivity: 40 W/mK
Radiation rate of heating unit: 0.8
Heating unit inner radius: 200 mm (distance d between heating unit and crucible: 50 mm)
Center position of heating unit: center position of heating unit in a height direction
Center temperature of heating unit: 2,400° C.

Example 1

Example 1 is different from Comparative Example 1 only at a point that the low radiation portion satisfying the following conditions is provided. The other conditions were the same as in Comparative Example 1.

Height of low radiation portion: 50 mm
Position of low radiation portion: intersection of a line segment connecting the center of upper surface of crucible and the heating center, and a crucible coincides with a center height of the low radiation portion in height direction
Radiation rate of low radiation portion: 0.2 (corresponding to TaC)

Example 2

Example 2 is different from Example 1 in that the height of the low radiation portion is 100 mm. The other conditions were the same as in Example 1.

In comparison of results of Comparative Example 1, Example 1, and Example 2, a temperature of the crystal installation portion in Example 1 was lower than the temperature of the crystal installation portion in Comparative Example 1 by 3.9° C., and a temperature of the crystal installation portion in Example 2 was lower than the temperature of the crystal installation portion in Comparative Example 1 by 9.1° C.

Example 3

Example 3 is different from Comparative Example 1 only at a point that the high radiation portion satisfying the following conditions is provided. The other conditions were the same as in Comparative Example 1.

Height of high radiation portion: 50 mm
Position of high radiation portion: intersection of a line segment connecting the center of lower surface of crucible and the beating center, and a crucible coincides with a center height of the high radiation portion in height direction
Radiation rate of high radiation portion: 1.0

Example 4

Example 4 is different from Example 1 in that the height of the high radiation portion is 100 mm. The other conditions were the same as in Example 3.

In comparison of results of Comparative Example 1. Example 3, and Example 4, a temperature of the lower surface of the crucible (corresponding to the center of the raw material contained) in Example 3 was higher than the temperature of the lower surface of the crucible of Comparative Example 1 by 0.6° C., and the temperature of the raw material installation portion of Example 4 was higher than the temperature of the lower surface of the crucible of Comparative Example 1 by 1.2° C.

10, 10A, 50, 50A: crucible
11, 11A, 51, 51A: main body portion
12, 12A: low radiation portion
52, 52A: high radiation portion
13, 53: crystal installation portion
53S: crystal side portion
54: guide portion
20: heat insulating material
30: heating unit
40: support
100, 100A, 101, 101A. 102, 103: crystal growing apparatus
S: seed crystal
C: single crystal K: growth space
C: raw material
p1: heating center

What is claimed is:

1. A crystal growing apparatus comprising:
a crucible which includes a main body portion, and a first portion having a radiation rate different from that of the main body portion, and is capable of controlling a temperature of a specific region inside of the crucible during heating to a higher or lower temperature than that of other regions; and
a heating unit which is positioned on the outside of the crucible and is configured to heat the crucible by radiant heat,
wherein the first portion is at a position where the crucible and a line segment connecting a heating center of the heating unit and the specific region intersect with each other,
a height of the first portion is within 50% of a height of the crucible,
the specific region is one or more selected from the group consisting of an outer portion in a radial direction of a portion where a seed crystal is installed in the crucible, and a guide portion which is configured to control a flow of a raw material gas from the raw material towards the seed crystal and has a diameter decreasing from a surface of the raw material toward the seed crystal, and
a radiation rate of the first portion is higher than a radiation rate of the main body portion.

2. The crystal growing apparatus according to claim 1, wherein the first portion is exposed to an outer surface of the crucible at a position where the crucible and the line segment connecting the heating center of the heating unit and the specific region intersect with each other.

3. The crystal growing apparatus according to claim 1, wherein an outer surface of the main body portion is a flat surface, and
an outer surface of the first portion is uneven.

4. The crystal growing apparatus according to claim 2, wherein an outer surface of the main body portion is a flat surface, and
an outer surface of the first portion is uneven.

5. The crystal growing apparatus according to claim 1, further comprising:
a support,
wherein the support is positioned on a lower portion of the crucible and supports the crucible, and
the support rotates in a radial direction.

6. The crystal growing apparatus according to claim 1, further comprising:
a heat insulating material,
wherein the heat insulating material is a member having a thermal conductivity equal to or smaller than 5 W/mK.

7. The crystal growing apparatus according to claim 5, further comprising:
a heat insulating material,
wherein the heat insulating material is a member having a thermal conductivity equal to or smaller than 5 W/mK.

8. The crystal growing apparatus according to claim 7, wherein the support passes through the heat insulating material and projects downward from the crucible.

* * * * *